(12) United States Patent
Hatori et al.

(10) Patent No.: US 7,835,418 B2
(45) Date of Patent: Nov. 16, 2010

(54) OPTICAL SEMICONDUCTOR DEVICE HAVING DIFFRACTION GRATING DISPOSED ON BOTH SIDES OF WAVEGUIDE AND ITS MANUFACTURE METHOD

(75) Inventors: Nobuaki Hatori, Kanagawa (JP);
Tsuyoshi Yamamoto, Kawasaki (JP);
Yasuhiko Arakawa, Kanagawa (JP)

(73) Assignees: Fujitsu Limited, Kawasaki (JP); The University of Tokyo, Tokyo (JP)

( * ) Notice: Subject to any disclaimer, the term of this patent is extended or adjusted under 35 U.S.C. 154(b) by 147 days.

(21) Appl. No.: 11/976,123

(22) Filed: Oct. 22, 2007

(65) Prior Publication Data
US 2008/0144691 A1     Jun. 19, 2008

(30) Foreign Application Priority Data
Dec. 14, 2006   (JP)   ............... 2006-336800

(51) Int. Cl.
*H01S 3/08* (2006.01)
(52) U.S. Cl. ............ 372/96; 372/45.01; 372/49.01; 372/50.11; 372/92; 372/98; 372/102
(58) Field of Classification Search ............ 372/92, 372/96, 98, 45.01, 49.01, 50.11, 102
See application file for complete search history.

(56) References Cited
U.S. PATENT DOCUMENTS
7,177,335 B2 *   2/2007   Kamp et al. ............ 372/46.01
7,359,423 B2 *   4/2008   Okunuki ............ 372/96
7,496,127 B2 *   2/2009   Matsuda et al. ............ 372/102
2005/0276302 A1   12/2005   Okunuki
2007/0133648 A1 *   6/2007   Matsuda et al. ............ 372/102

FOREIGN PATENT DOCUMENTS
JP   8-167759   6/1996
JP   2005-353761   12/2005

* cited by examiner

*Primary Examiner*—Minsun Harvey
*Assistant Examiner*—Yuanda Zhang
(74) *Attorney, Agent, or Firm*—Kratz, Quintos & Hanson, LLP

(57) ABSTRACT

An active layer (18) is formed over a semiconductor substrate having a pair of facets (15A, 15B) mutually facing opposite directions. An upper cladding layer (19) is formed on the active layer, having a refractive index lower than that of the active layer. A diffraction grating (25) is disposed in the upper cladding layer on both sides of a distributed feedback region in a waveguide region (22), the waveguide region extending from one facet to the other of the semiconductor substrate. End regions (22B) are defined at both ends of the waveguide region and the distributed feedback region (22A) is disposed between the end regions. Low refractive index regions (26) are disposed in the upper cladding layer on both sides of each of the end regions of the waveguide region, the low refractive index regions having a refractive index lower than that of the upper cladding layer.

10 Claims, 10 Drawing Sheets

$2(L_B+L_C)$

OPTICAL SEMICONDUCTOR DEVICE HAVING DIFFRACTION GRATING DISPOSED ON BOTH SIDES OF WAVEGUIDE AND ITS MANUFACTURE METHOD

CROSS REFERENCE TO RELATED APPLICATION

This application is based on and claims priority of Japanese Patent Application No. 2006-336800 filed on Dec. 14, 2006, the entire contents of which are incorporated herein by reference.

BACKGROUND OF THE INVENTION

A) Field of the Invention

The present invention relates to an optical semiconductor device and its manufacture method, and more particularly to an optical semiconductor device having a diffraction grating disposed on both sides of a waveguide and its manufacture method.

B) Description of the Related Art

Regrowth structure and vertical diffraction grating structure are known as structures of a distributed feedback (DFB) semiconductor laser device. In the regrowth structure, after a diffraction grating is formed on the surface of a growth layer, a semiconductor layer is regrown thereon. In the vertical diffraction grating structure, after all semiconductor layers are formed, a refraction grating is formed by partially etching the surface layer of the semiconductor layer. As the number of growth of semiconductor layers increases, a manufacture cost rises. It is therefore preferable to adopt the vertical diffraction grating structure for a DFB laser used in a market requiring low cost.

FIG. 10A shows a plan cross sectional view of a DFB laser device of the vertical diffraction grating structure, and FIG. 10B shows a cross sectional view taken along one-dot chain line 10B-10B shown in FIG. 10A. A cross sectional view taken along one-dot chain line 10A-10A shown in FIG. 10B corresponds to FIG. 10A. The DFB laser device is disclosed, for example, in JP-A-HEI-8-167759.

As shown in FIG. 1A, a waveguide region 101 is defined in the surface layer of a semiconductor substrate 100, the waveguide region 101 extending from one facet to the other of a pair of facets facing mutually opposite directions. A diffraction grating 102 is disposed on both sides of the waveguide region 101. An antireflection film 103 or a high reflection film 104 is formed on each of the pair of facets.

As shown in FIG. 10B, a lower cladding layer 110, a waveguide layer 111, an active layer 112, an upper cladding layer 113 and a contact layer 114 are laminated in this order on the semiconductor substrate 100. The diffraction grating 102 is constituted of low refractive index material filling a plurality of recesses reaching an intermediate depth of the upper cladding layer 113. An upper electrode 115 is formed on the contact layer 114, and a lower electrode 116 is formed on the bottom of the semiconductor substrate 100.

In the DFB laser device shown in FIGS. 10A and 10B, the opposite facets of the waveguide region 101 are formed, for example, by cleaving the substrate 100. Since cracks are likely formed while the substrate is cleaved, it is difficult to form facets at target positions. For example, a facet is formed in some cases at a position shifted from the target position by one period of the diffraction grating. Positions of the facet of one diffraction grating and the facet of the other diffraction grating are not in alignment with each other in some cases.

JP-A-2005-353761 discloses a DFB laser device of the regrowth structure not disposing a diffraction grating near the facets. This structure may be applied to a DFB laser device of the vertical diffraction grating structure.

FIG. 10C shows a plan cross sectional view of a DFB laser device of the vertical diffraction grating structure adopting the structure disclosed in JP-A-2005-353761. Regions 118 not disposing a diffraction grating 102 are provided near the facets of the DFB laser device. Since the diffraction grating 102 of this DFB laser device is positioned away from the cleaved facets, cracks are hard to be formed during cleavage.

In a DFB laser device of the regrowth structure, a ridge defining a waveguide extends from one facet to the other of the DFB laser device. Therefore, optical confinement in the width direction is realized in the whole region of the waveguide. In a DFB laser device of the vertical diffraction grating structure, however, light is confined in the width direction by the diffraction gratings 102 shown in FIGS. 10A and 10C. Since the diffraction gratings are not formed in the regions 118 near the facets of the DFB laser device, optical confinement in the width direction is not realized, but optical confinement is realized only in the thickness direction in these regions 118. Namely, the regions 118 function as a slab waveguide.

Therefore, a transverse mode shape of light confined in the region 118 not disposing the diffraction grating changes from a desired shape. A coupling efficiency between a DFB laser device and an optical fiber is therefore lowered.

SUMMARY OF THE INVENTION

According to one aspect of the present invention, there is provided an optical semiconductor device including:

a semiconductor substrate having a pair of facets mutually facing opposite directions;

an active layer formed over the semiconductor substrate;

an upper cladding layer formed on the active layer and having a refractive index lower than a refractive index of the active layer;

a diffraction grating disposed in the upper cladding layer on both sides of a distributed feedback region in a waveguide region, the waveguide region extending from one facet to the other of the semiconductor substrate, end regions being defined at both ends of the waveguide region, and the distributed feedback region being disposed between the end regions; and low refractive index regions disposed in the upper cladding layer on both sides of each of the end regions of the waveguide region, the low refractive index regions having a refractive index lower than a refractive index of the upper cladding layer.

According to another aspect of the present invention, there is provided a method for manufacturing an optical semiconductor device, including steps of:

(a) sequentially forming an active layer and an upper cladding layer over a semiconductor substrate;

(b) defining a waveguide region alternately disposing a distributed feedback region and end regions in one direction, in a surface layer of the semiconductor substrate, forming a plurality of first recesses on both sides of the distributed feedback region, the first recesses being periodically disposed in a longitudinal direction of the waveguide region, and forming second recesses on both sides of each of the end regions, the second recesses being longer in the longitudinal direction of the waveguide region than each of the first recesses disposed on both sides of the distributed feedback region; and (c) cutting the semiconductor substrate through the end regions to expose cut facets crossing the longitudinal direction of the waveguide region.

DESCRIPTION OF THE PREFERRED EMBODIMENTS

Figure 1A:
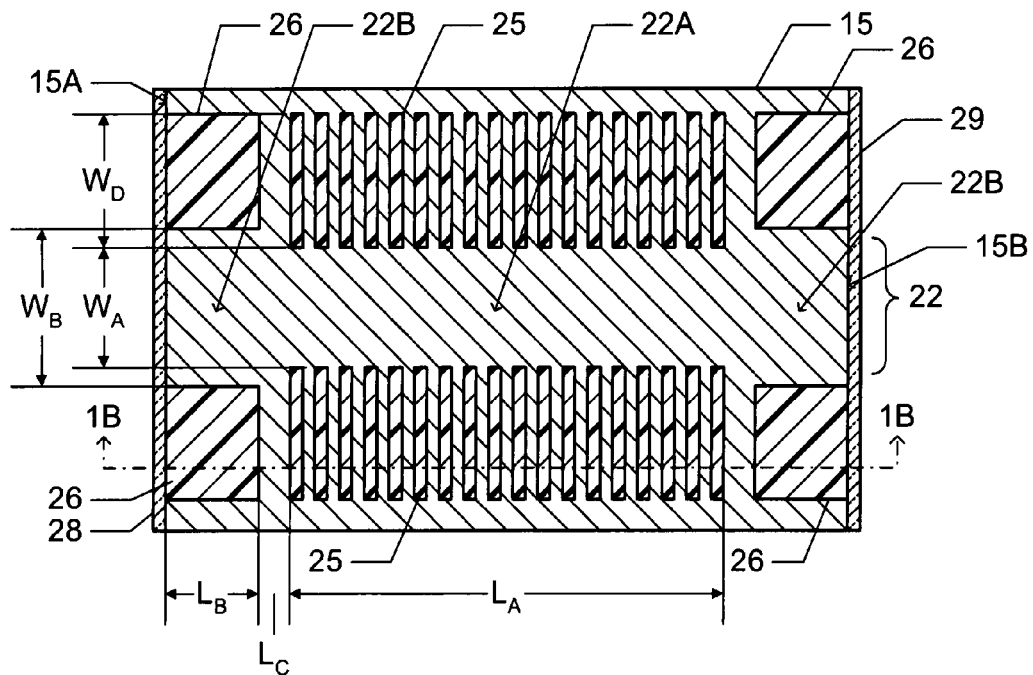
FIG. 1A is a plan cross sectional view of an optical semiconductor device according to a first embodiment.
Figure 1B:
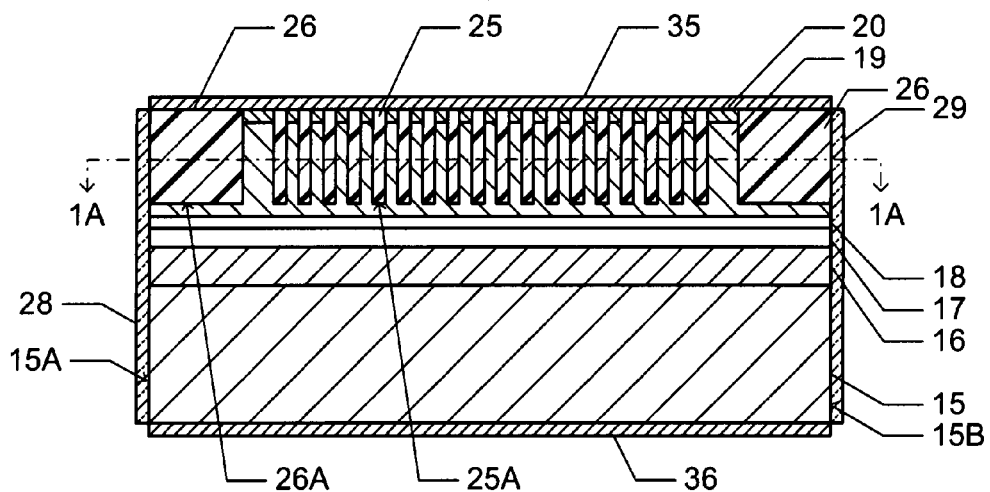
FIG. 1B is a cross sectional view taken along one-dot chain line 1B-1B shown in FIG. 1A.

FIG. 1A shows a plan cross sectional view of an optical semiconductor device according to the first embodiment, and FIG. 1B is a cross sectional view taken along one-dot chain line 1B-1B shown in FIG. 1A. A cross sectional view taken along one-dot chain line 1A-1A shown in FIG. 1B corresponds to FIG. 1A.

As shown in FIG. 1A, on the surface of a semiconductor substrate 15 having a pair of facets 15A and 15B facing mutually opposite directions, a waveguide region 22 is defined extending from one facet 15A to the other facet 15B. Light is guided along the waveguide region 22, the light traveling from one facet 15A to the other facet 15B and vice versa. The waveguide region 22 is constituted of end regions 22B disposed at opposite ends of the substrate and a distributed feedback region 22A disposed inside.

A diffraction grating 25 is disposed on both sides of the distributed feedback region 22A. A low refractive index region 26 is disposed on both sides of each of the end regions 22B. A width $W_A$ of the distributed feedback region 22A is defined by the diffraction gratings 25. A width $W_B$ of each of the end regions 22B is defined by the low refractive index regions 26. For example, the width $W_A$ of the distributed feedback region 22A is 2 µm, and the width $W_B$ of the end region 22B is 5 µm. A size (width) $W_D$ of each of the diffraction gratings 25 in a direction perpendicular to the waveguide direction is, e.g., 5 µm.

A length $L_A$ of the diffraction grating 25 in the waveguide direction is, e.g., 440 µm, and a size (length) $L_B$ of the low refractive index region 26 in the waveguide direction is, e.g., 10 µm. A period of the diffraction grating 25 is, e.g., 192 nm. The diffraction grating 25 and low refractive index region 26 are disposed away from each other by a distance $L_C$ in the waveguide direction, and the distance $L_C$ is, e.g., 5 µm.

An optical film 28 is formed on one facet 15A, and an optical film 29 is formed on the other facet 15B. Each of the optical films 28 and 29 is an antireflection film, a low reflection film or a high reflection film.

As shown in FIG. 1B, a lower cladding layer 16 of n-type $Al_{0.4}Ga_{0.6}As$ is formed on the semiconductor substrate 15 made of n-type GaAs. The surface of the semiconductor substrate 15 has an orientation corresponding to the (001) plane of GaAs. A thickness of the lower cladding layer 16 is, e.g., 1.4 µm.

A waveguide layer 17 having a thickness of 36 nm and made of non-doped GaAs is formed on the lower cladding layer 16. An active layer 18 is formed on the waveguide layer 17. The active layer 18 has a lamination structure in which ten quantum dot layers of InAs and ten barrier layers having a thickness of 36 nm and made of GaAs are alternately stacked.

On the active layer 18, there is formed an upper cladding layer 19 having a thickness of 1.4 µm and made of p-type $Al_{0.4}Ga_{0.6}As$. On the upper cladding layer 19, there is formed a contact layer 20 having a thickness of 0.4 µm and made of p-type GaAs.

Formed in the contact layer 20 and upper cladding layer 19 are a plurality of recesses 25A matching a plan pattern of the diffraction gratings 25 and a plurality of recesses 26A matching a plan pattern of the low refractive index regions 26. Resin having a refractive index lower than that of the upper cladding layer 19 fills these recesses. The resin filling the recesses 25A serves as the diffraction gratings 25, and the resin filling in the recesses 26A serves as the low refractive index regions 26.

A refractive indices of the lower cladding layer 16 and upper cladding layer 19 are lower than that of the active layer 18.

An upper electrode 35 is formed on the contact layer 20, and a lower electrode 36 is formed on the bottom of the semiconductor substrate 15. The upper electrode 35 has a two-layer structure of an AuZn layer and an Au layer, and covers also the upper surfaces of the diffraction gratings 25 and low refractive index regions 26. The lower electrode 36 has a two-layer structure of an AuGe layer and an Au layer.

Next, with reference to FIGS. 2A to 8B, description will be made on a manufacture method for the optical semiconductor device of the first embodiment. FIGS. 2A, 3A, 4A, 5A, 6A, 7A and 8A show plan views of the device during manufacture, FIGS. 2B, 3B, 4B, 5B, 6B, 7B and 8B show cross sectional views taken along one-dot chain lines 2B-2B, 3B-3B, 4B-4B, 5B-5B, 6B-6B, 7B-7B and 8B-8B respectively shown in FIGS. 2A, 3A, 4A, 5A, 6A, 7A and 8A.

Figure 2A:
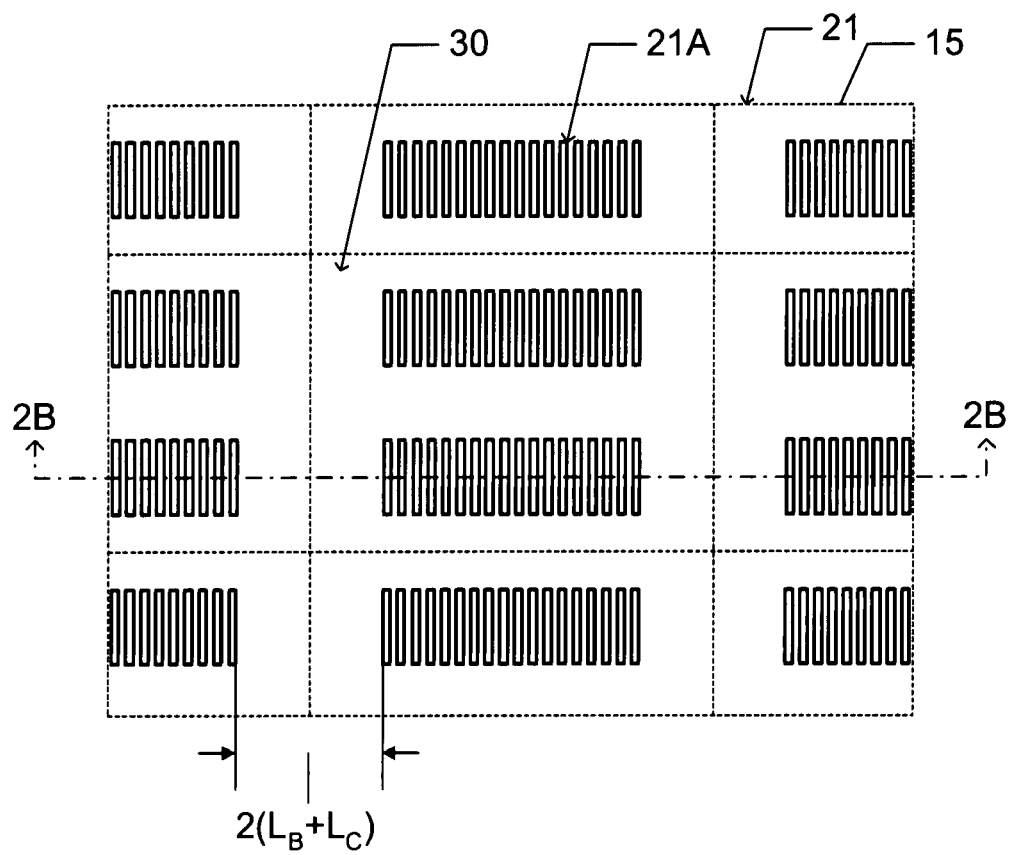
FIG. 2A is a plan view of the optical semiconductor device of the first embodiment during manufacture.
Figure 2B:
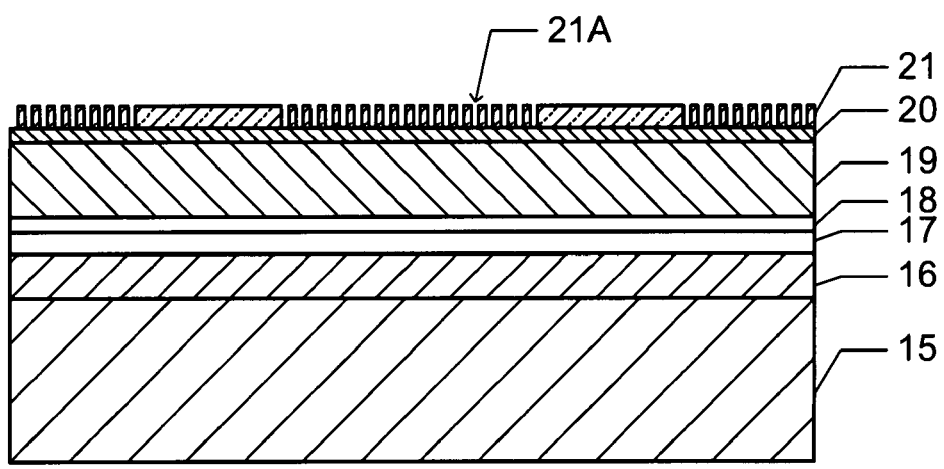
FIG. 2B is a cross sectional view taken along one-dot chain line 2B-2B shown in FIG. 2A.

As shown in FIG. 2B, a lower cladding layer 16 of n-type $Al_{0.4}Ga_{0.6}As$, a waveguide layer 17 of non-doped GaAs, an active layer 18 including quantum dot layers, an upper cladding layer 19 of p-type $Al_{0.4}Ga_{0.6}As$ and a contact layer 20 of p-type GaAs are formed, for example, by molecular beam epitaxial (MBE) growth on a semiconductor substrate 15 made of n-type GaAs and having the (001) plane as its principal surface. The quantum dot layer constituting the active layer 18 may be formed by a self-assembling method.

A mask layer 21 having a thickness of 300 nm and made of silicon oxide ($SiO_2$) is formed on the contact layer 20 by chemical vapor deposition (CVD). Openings 21A corresponding to a plan shape of the diffraction gratings are formed through the mask layer 21. The openings 21A are formed through a set of processes including forming an electron beam exposure resist film, electron beam exposure, resist film development, etching the mask film 21, and removing the resist film.

As shown in FIG. 2A, chip regions 30 disposed in a matrix pattern are defined on the surface of the semiconductor substrate 15. Although the border line of each chip region 30 is indicated by a broken line in FIG. 2A, this border line is virtual and no border line is formed actually on the surface of the semiconductor substrate 15. One optical semiconductor device is formed in one chip region 30. Each diffraction grating to be later formed has a periodical structure along a row direction (lateral direction in FIG. 2A) in the chip region 30. Diffraction gratings in a plurality of chip regions disposed in the same row are disposed at the same position in the column direction, and diffraction gratings in a plurality of chip regions disposed in the same column are disposed at the same position in the row direction. A distance from the end of the diffraction grating to the outer border line of the chip region 30 is approximately equal to the total sum of the length $L_B$ of the low refractive index region 26 and the distance $L_C$ shown in FIG. 1B. Namely, two adjacent diffraction gratings in the row direction are spaced by twice as long as $L_B+L_C$.

By using the mask layer 21 as an etching mask, the contact layer 20 and upper cladding layer 19 are etched to the upper surface of the active layer 18 or to the intermediate depth of the upper cladding layer 19. Dry etching using, for example, chlorine-based gas is applied to this etching.

Figure 3A:
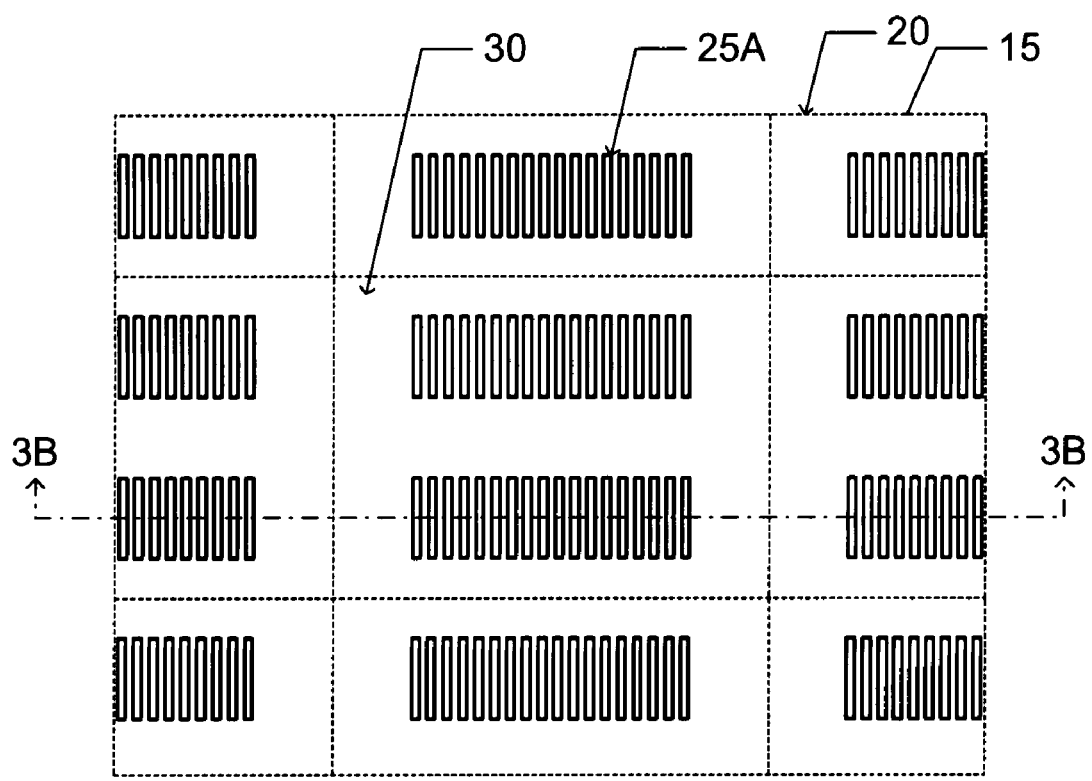
FIG. 3A is a plan view of the optical semiconductor device of the first embodiment during manufacture.
Figure 3B:
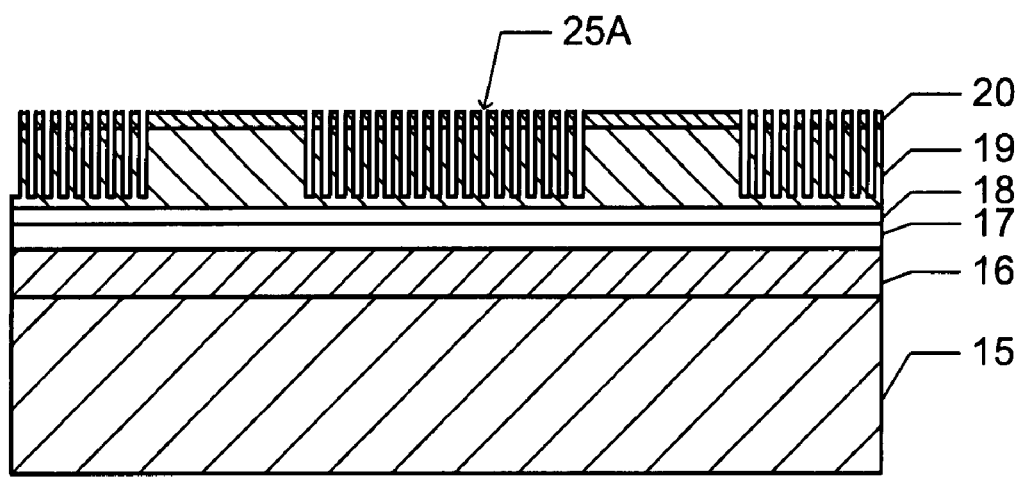
FIG. 3B is a cross sectional view taken along one-dot chain line 3B-3B shown in FIG. 3A.

As shown in FIGS. 3A and 3B, recesses 25A matching the plan pattern of the diffraction gratings are therefore formed through the contact layer 20 and in or through the upper cladding layer 19. After the recesses 25A are formed, the mask layer 21 is removed.

Figure 4A:
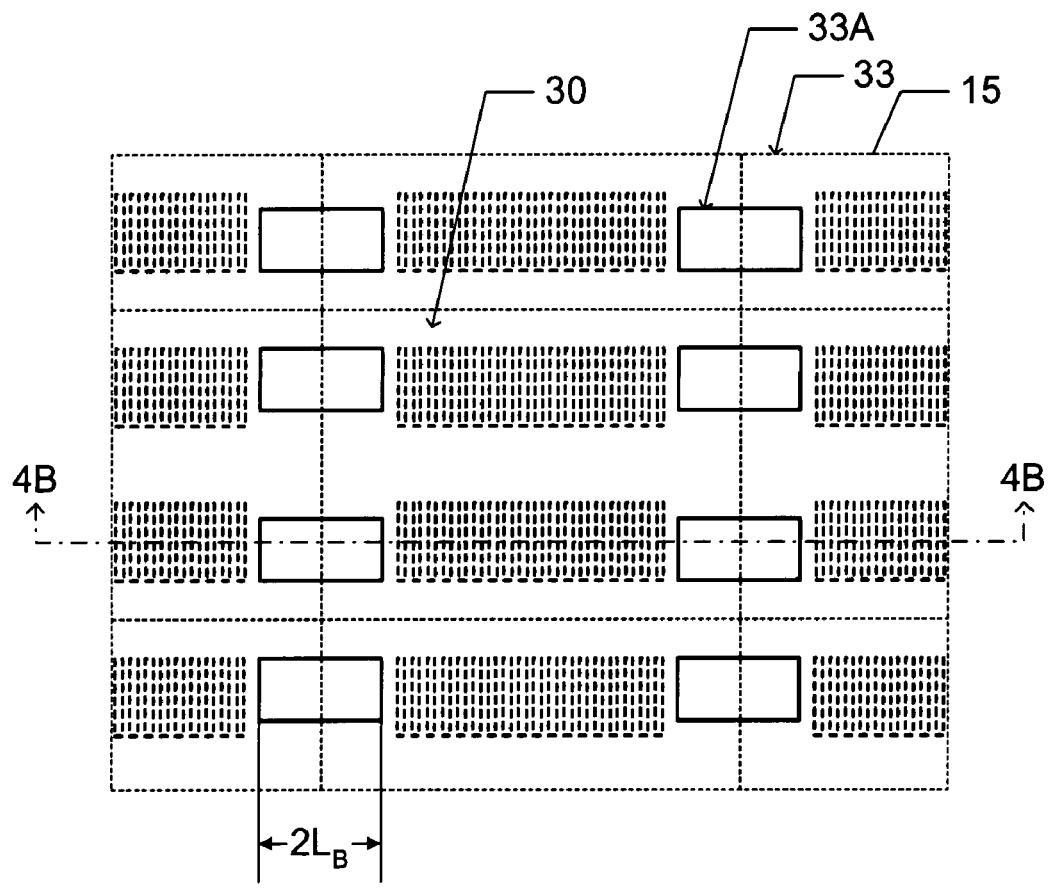
FIG. 4A is a plan view of the optical semiconductor device of the first embodiment during manufacture.
Figure 4B:
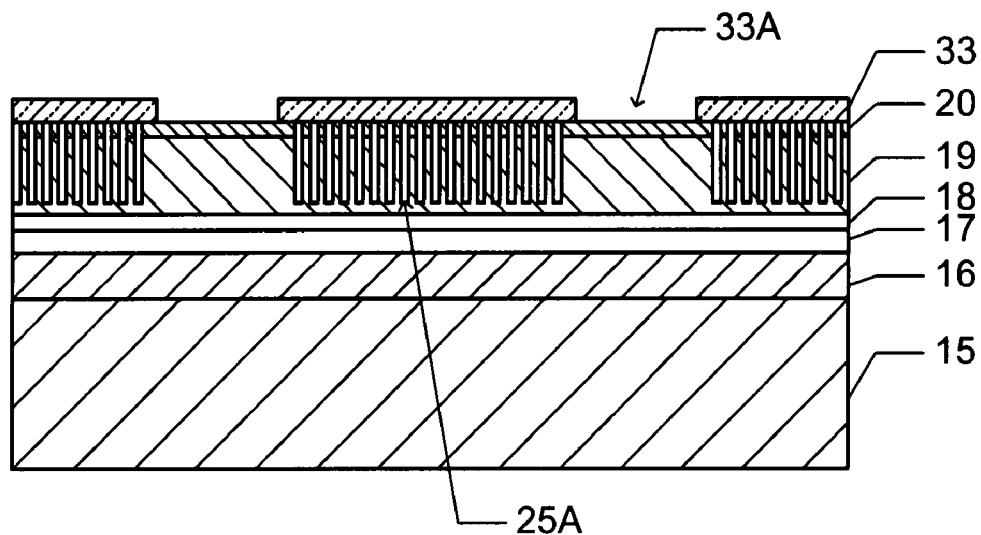
FIG. 4B is a cross sectional view taken along one-dot chain line 4B-4B shown in FIG. 4A.

As shown in FIGS. 4A and 4B, a mask layer 33 having a thickness of 300 nm and made of $SiO_2$ is formed on the contact layer 20 by CVD. Since the aspect ratio of each recess 25A is high, the recesses 25A are not filled with silicon oxide.

Openings 33A matching the plan pattern of the low refractive index regions 26 shown in FIGS. 1A and 1B are formed through the mask layer 33. Each opening 33A is continuous from one low refractive index region 26 to the other low refractive index region 26 of two adjacent chip regions 30 in the row direction. Therefore, a length of the opening 33A in each row direction is twice as long as the length $L_B$ of one low refractive index region 26.

By using the mask layer 33 as an etching mask, the contact layer 20 and upper cladding layer 19 are etched. An etching depth is generally the same as that of the recess 25A shown in FIG. 3B.

Figure 5A:
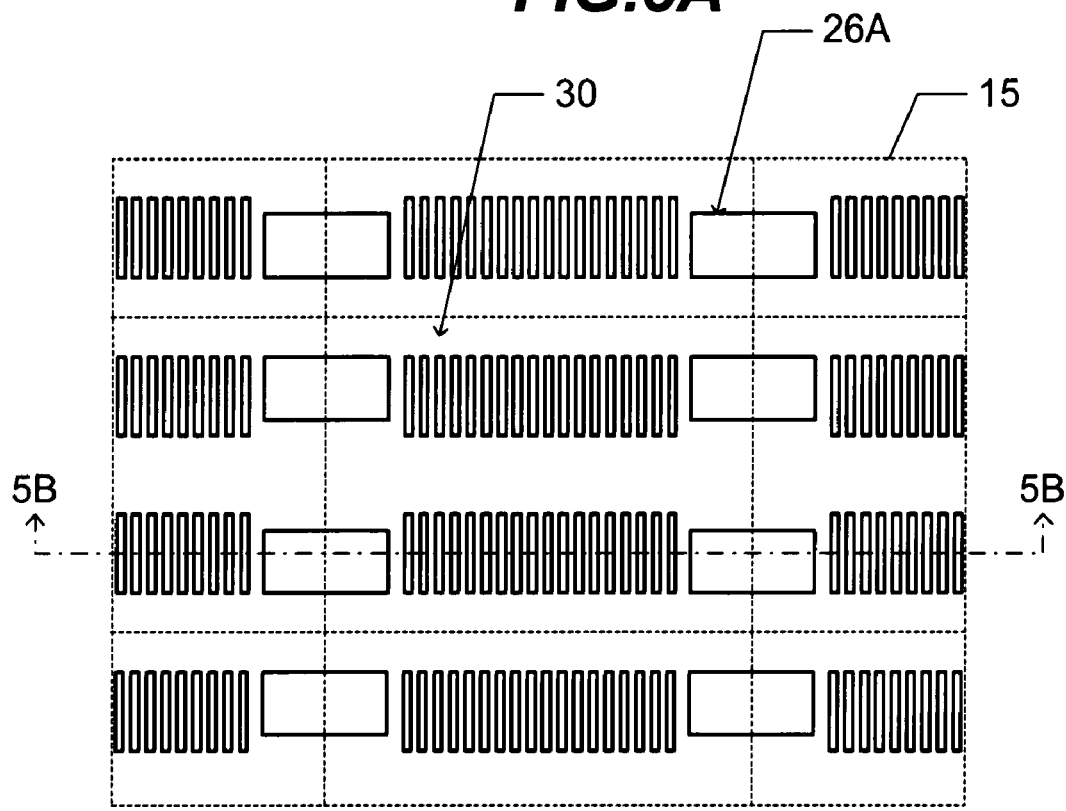
FIG. 5A is a plan view of the optical semiconductor device of the first embodiment during manufacture.
Figure 5B:
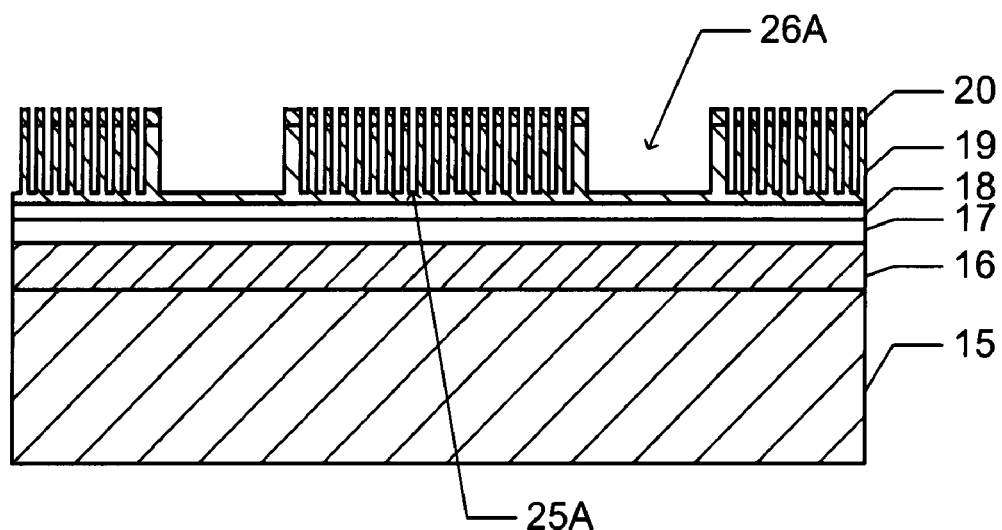
FIG. 5B is a cross sectional view taken along one-dot chain line 5B-5B shown in FIG. 5A.

As shown in FIGS. 5A and 5B, recesses 26A matching the plan pattern of the low refractive index regions 26 are therefore formed through the contact layer 20 and in or through the upper cladding layer 19. After the recesses 26A are formed, the mask layer 33 is removed.

Figure 6A:
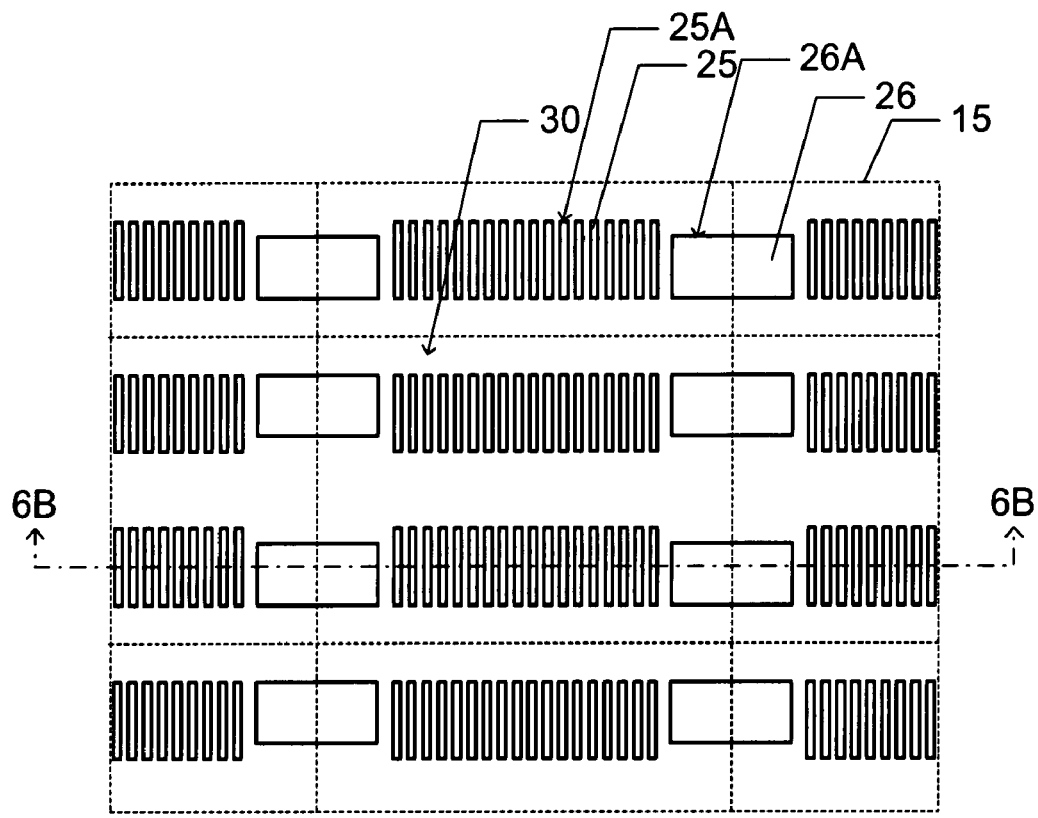
FIG. 6A is a plan view of the optical semiconductor device of the first embodiment during manufacture.
Figure 6B:
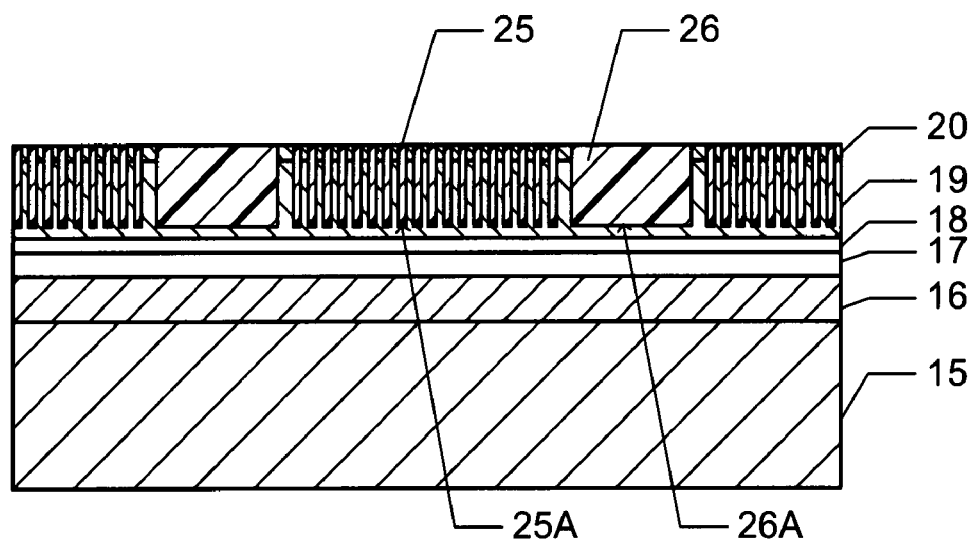
FIG. 6B is a cross sectional view taken along one-dot chain line 6B-6B shown in FIG. 6A.

As shown in FIGS. 6A and 6B, the recesses 25A and 26A are filled with insulating material such as ultraviolet curable resin. After resin filling, ultraviolet rays are irradiated to cure the resin. A refractive index of the insulating material filling the recesses 25A and 26A is lower than that of the upper cladding layer 19.

Figure 7A:
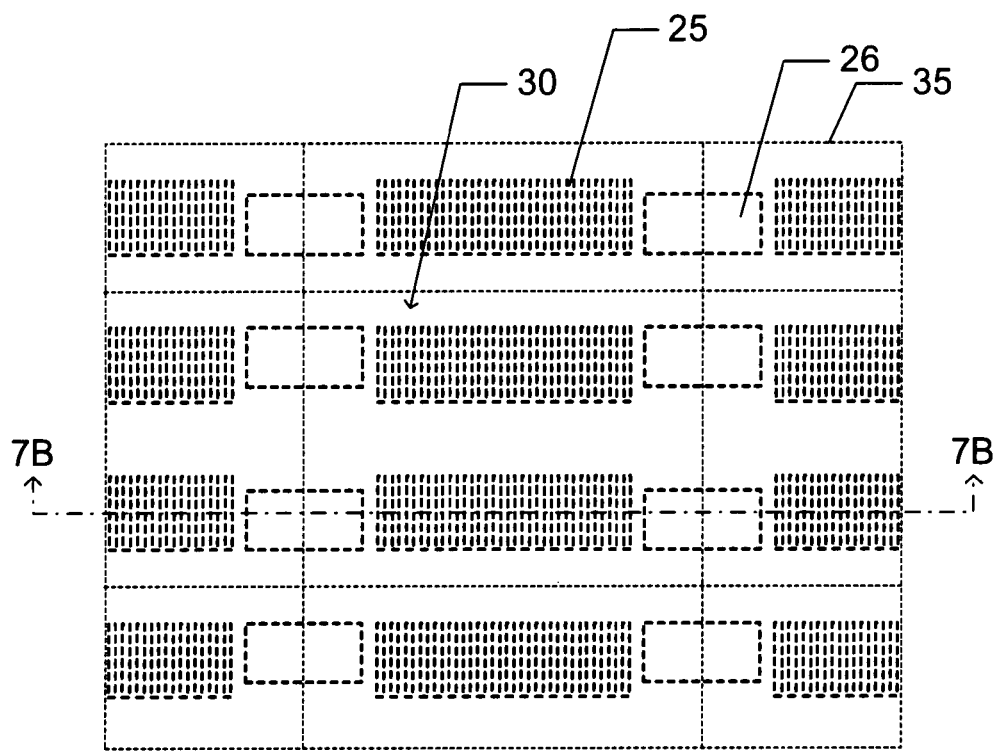
FIG. 7A is a plan view of the optical semiconductor device of the first embodiment during manufacture.
Figure 7B:
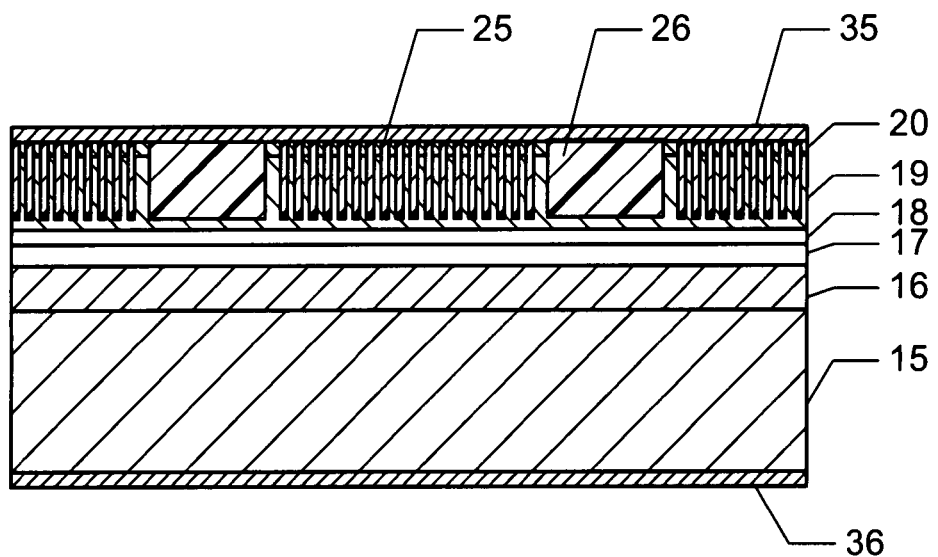
FIG. 7B is a cross sectional view taken along one-dot chain line 7B-7B shown in FIG. 7A.

As shown in FIGS. 7A and 7B, an upper electrode 35 of AuZn/Au is formed on the contact layer 20, and a lower electrode 36 of AuGe/Au is formed on the bottom surface of the semiconductor substrate 15. It is sufficient for the upper electrode 35 to be formed at least over a region corresponding to the waveguide region 22 shown in FIG. 1A.

In addition, a region other than the waveguide region 22 may be covered by an insulating film, e.g., $SiO_2$ film. When the insulating film is formed, the upper electrode 35 is formed on the contact layer 20 and the insulating film.

Figure 8A:
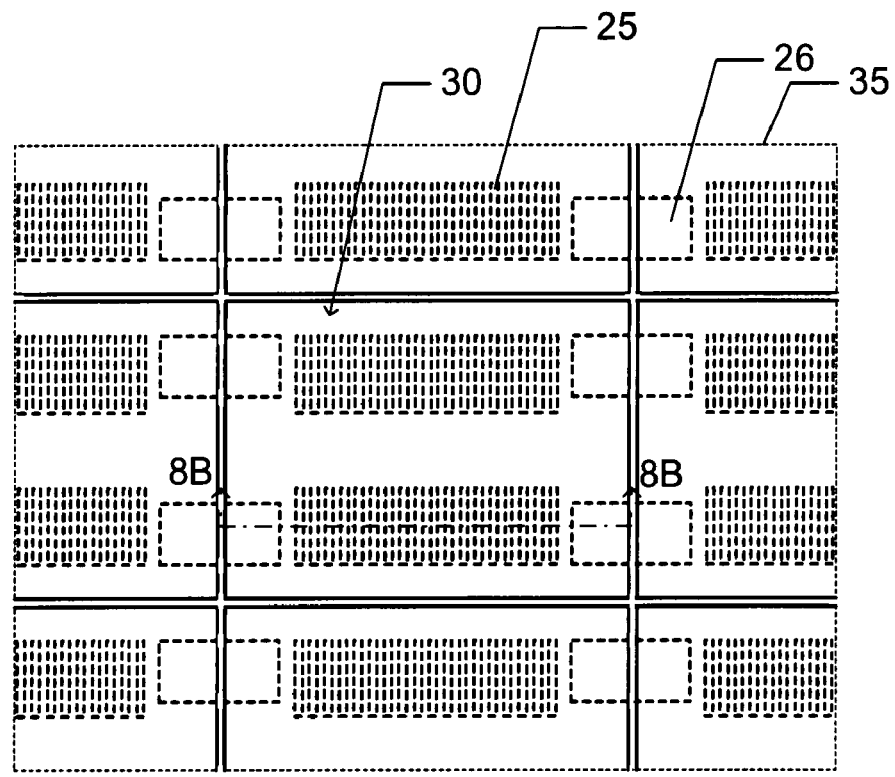
FIG. 8A is a plan view of the optical semiconductor device of the first embodiment during manufacture.
Figure 8B:
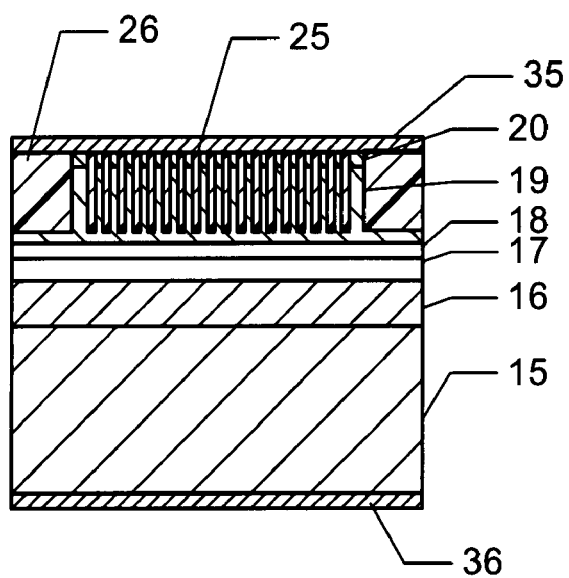
FIG. 8B is a cross sectional view taken along one-dot chain line 8B-8B shown in FIG. 8A.

As shown in FIG. 8A, the semiconductor substrate 15 is cleaved along the border lines of the chip regions 30. After cleavage, optical films 28 and 29 are formed as shown in FIGS. 1A and 1B. Border lines of the chip regions 30 extending in the column direction pass approximately the centers of each low refractive index region 26, and are spaced from the diffraction grating 25 by an end region 22B length of $L_B+L_C$ shown in FIG. 1A. Cracks are therefore hard to be generated during cleavage and the chip facets can be positioned at the target positions.

In the optical semiconductor device of the first embodiment, carriers are injected into the active layer 18 from the upper electrode 35 and lower electrode 36. Since the refractive indices of the diffraction grating 25 and low refractive index region 26 are lower than that of the upper cladding layer 19, a waveguide is formed along the waveguide region 22 between the diffraction gratings 25 and between the low refractive index regions 26.

A portion of light propagating in the distributed feedback region 22A of the waveguide region 22 is Bragg-reflected by coupling the diffraction grading 25. Light not reflected in the distributed feedback region 22A passes through the end region 22B and transmits through the optical film 28 or 29 to be irradiated to an external.

Light is confined transversely in the end region 22B by the low refractive index regions 26. It is therefore possible to suppress coupling efficiency reduction between the optical semiconductor device and an optical fiber disposed in the external. According to the theoretical calculations by the present inventors, it has been found that a coupling efficiency between the optical semiconductor device of the first embodiment and an optical fiber is higher by about 30% than a coupling coefficient between an optical fiber and an optical semiconductor device not having the low refractive index regions 26 and having the end regions 22B whose length is set to 15 μm.

In the first embodiment, although the length $L_B$ of the low refractive index region 26 is set to 10 μm and the distance $L_C$ between the diffraction grating 25 and low refractive index region 26 is set to 5 μm, the length $L_B$ and distance $L_C$ are not limited thereto. The length $L_B$ of the low refractive index region 26 needs only be longer than a length enough for cleaving the substrate at the target positions with good reproducibility. For example, the length $L_B$ and distance $L_C$ may be set to 5 μm and 10 μm, respectively. In this case, it is possible to obtain a coupling efficiency between an optical fiber and the optical semiconductor device higher by about 10% than that between an optical fiber and an optical semiconductor device not having the low refractive index regions 26 and having the end regions 22B whose length is set to 15 μm.

It is preferable to set the length $L_B$ of the low refractive index region 26 to 5 μm or longer in order to obtain the effects sufficient for suppressing a variation in the facet position to be caused by cracks during cleavage. If the length $L_B$ of the low refractive index region 26 is set longer than the size (thickness) in the waveguide direction of each recess 25A constituting the diffraction grating 25, the low refractive index region 26 can be clearly distinguished from the diffraction grating 25.

In the first embodiment described above, the region in the distance $L_C$ between the diffraction grating 25 and low refractive index region 26 does not conduct transverse confinement of light. Namely, this region functions as the slab waveguide for confining light only in the thickness direction. As the slab waveguide becomes long, light expands in a transverse direction. It is therefore preferable to set the distance $L_C$ as short as possible. For example, the distance $L_C$ is preferably shortened to a half of the period of the diffraction grating 25.

It is difficult to form both the recesses 25A and 26A in the same process because of a large difference in aspect ratio. From this reason, in the first embodiment, the recesses 25A are formed first, and then the recesses 26A are formed by using a different mask. In the photolithography process of forming the openings 33A through the mask layer 33, position alignment of the openings 33A must be aligned by using the already formed recesses 25A as an alignment reference. If the distance $L_C$ is made too short, this position alignment becomes difficult. In order to overcome a position alignment difficulty, the distance $L_C$ is set to 5 µm. It is more preferable that the distance $L_C$ is shorter than ten times of the period of the diffraction grating 25, in order to suppress a loss to be caused by transverse diversion of light.

If the recesses 25A and 26A can be formed by single etching process with good reproducibility, the recesses 25A and 26A can be formed by a single lithography process. In this case, the distance $L_C$ between the diffraction grating 25 and low refractive index region 26 can be set to an ideal distance, i.e., can be narrowed to a half of the period of the diffraction grating 25.

In the first embodiment, the width $W_B$ of the end region 22B is set wider than the width $W_A$ of the distributed feedback region 22A. In the distributed feedback region 22A, there is penetration of light into the regions where the diffraction gratings 25 are disposed. Therefore, an optical intensity distribution in the transverse direction becomes wider than the width $W_A$ of the distributed feedback region 22A. By making the width $W_B$ of the end region 22B wider than the width $W_A$ of the distributed feedback region 22A, it becomes possible to reduce a radiation loss at the boundary between the distributed feedback region 22A and end region 22B. A radiation loss can be reduced sufficiently by setting the width $W_B$ of the end region 22B wider than the width $W_A$ of the distributed feedback region 22A by 0.5 µm or more.

Depending upon uses of an optical semiconductor device, the width $W_B$ of the end region 22B may be made equal to the width $W_A$ of the distributed feedback region 22A, or narrower than the width $W_A$. For example, as the width $W_B$ of the end region 22B is narrowed, higher-order transverse modes are hard to be generated. It is not necessary to set constant the width $W_B$ of the end region 22B in the waveguide direction. The width $W_B$ may be gradually widened or narrowed with distance from the diffraction grating 25.

Figure 9:
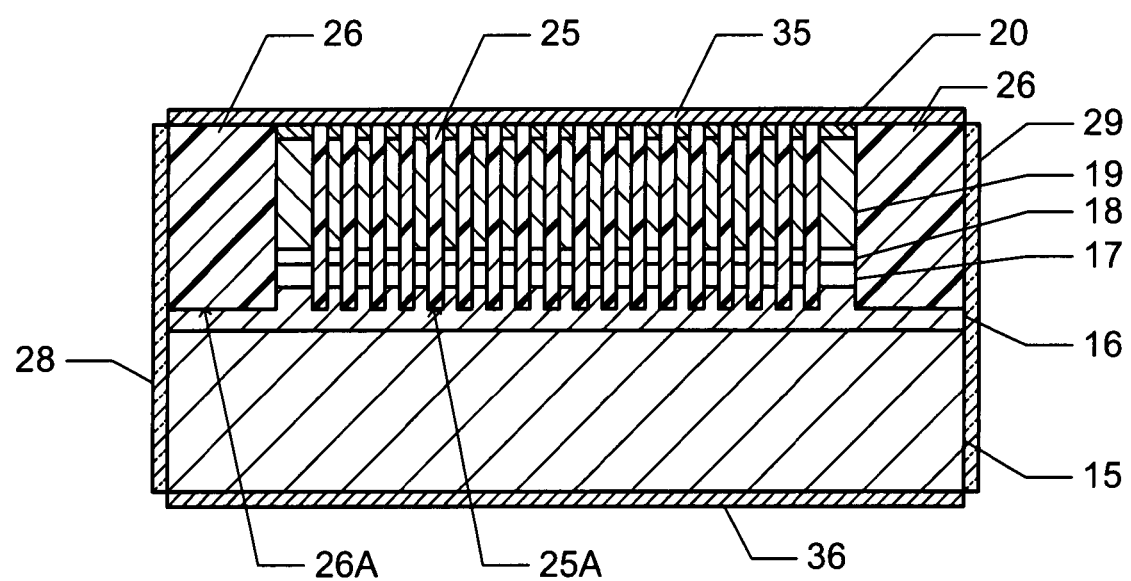
FIG. 9 is a cross sectional view of an optical semiconductor device according to a second embodiment.
Figure 10A:
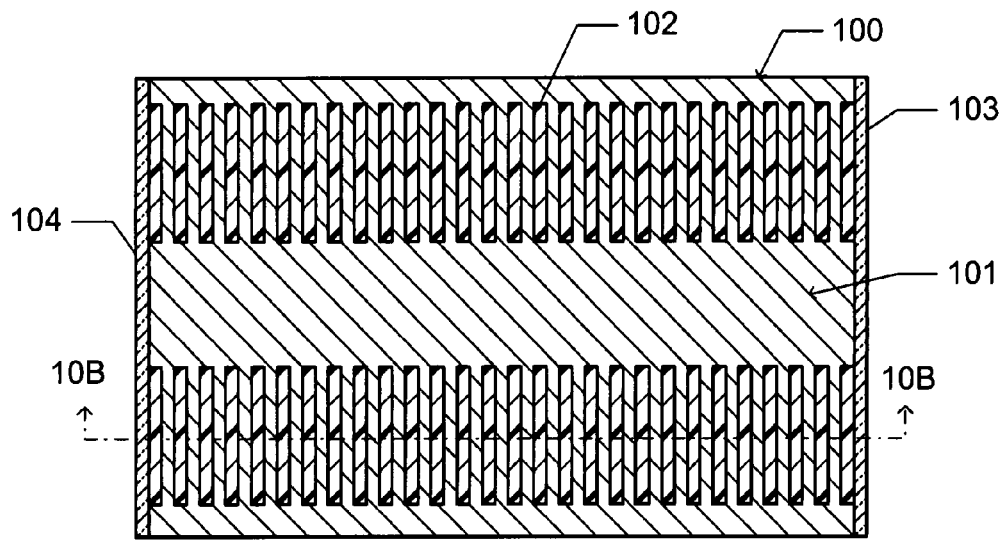
FIG. 10A is a plan cross sectional view of a conventional optical semiconductor device.
Figure 10B:
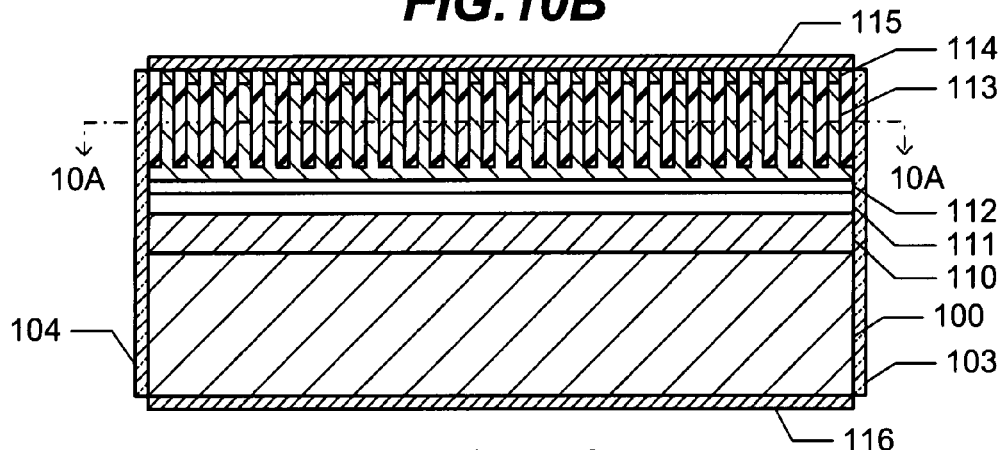
FIG. 10B is a cross sectional view taken along one-dot chain line 10B-10B shown in FIG. 10A.
Figure 10C:
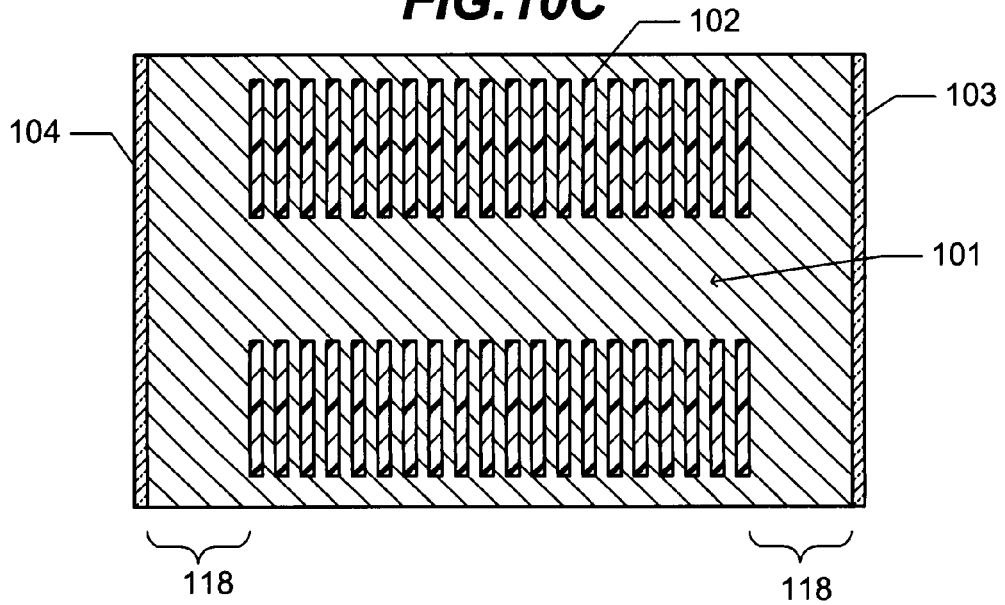
FIG. 10C is a cross sectional view of an improved device of the optical semiconductor device shown in FIG. 10A.

FIG. 9 is a cross sectional view of an optical semiconductor device of the second embodiment. In the first embodiment, the recesses 25A and 26A do not reach the upper surface of the active region 18. In the second embodiment, the recesses 25A and 26A reach the intermediate depth of the lower cladding layer 16. The other structures are the same as those of the optical semiconductor device of the first embodiment. The optical semiconductor device of the second embodiment is called a "high mesa structure".

As the depths of the recesses 25A and 26A change, an equivalent refractive index of the waveguide changes. It is therefore necessary to calculate the equivalent refractive index of a waveguide in accordance with the depths of the recesses 25A and 26A and determine the period of the diffraction grating 25 from the calculation results.

In the second embodiment, although both the distributed feedback region 22A and end region 22B have the high mesa structure, either one of the regions 22A and 22B may have the high mesa structure.

In the first and second embodiments described above, although the active layer 18 has the quantum dot structure, other structures may also be adopted. For example, a quantum well structure, a quantum wire structure or a bulk structure may also be used. A quantum dot active layer doped with p-type impurities may be used as the active layer 18.

Further, although the first and second embodiments described above adopt the structure that InAs/AlGaAs-based compound semiconductor layers are grown on the n-type GaAs substrate, a combination of other materials may also be used. For example, it is possible to adopt a structure that GaInAsP-based compound semiconductor layers or AlGaInAs-based compound semiconductor layers are formed on an InP substrate.

The semiconductor substrate 15 and lower cladding layer 16 may have p-type conductivity and the upper cladding layer 19 may have n-type conductivity.

A high resistance substrate may be used as the semiconductor substrate 15. In this case, since a lower electrode cannot be formed on the bottom of the semiconductor substrate 15, a recess reaching the lower cladding layer 16 is formed and the lower electrode is formed on the bottom of the recess.

The present invention has been described in connection with the preferred embodiments. The invention is not limited only to the above embodiments. It will be apparent to those skilled in the art that other various modifications, improvements, combinations, and the like can be made.

What are claimed are:

1. An optical semiconductor device comprising:
    a semiconductor substrate having a pair of facets mutually facing opposite directions;
    an active layer formed over the semiconductor substrate;
    an upper cladding layer formed on the active layer and having a refractive index lower than a refractive index of the active layer;
    a diffraction grating disposed in the upper cladding layer on both sides of a distributed feedback region in a waveguide region in planar view, the waveguide region extending in a first direction from one facet to the other of the semiconductor substrate, end regions being defined at both ends of the waveguide region in the first direction, and the distributed feedback region being disposed between the end regions; and
    low refractive index regions disposed in the upper cladding layer on both sides of each of the end regions of the waveguide region, the low refractive index regions being disposed between one facet of the semiconductor substrate and the diffraction grating and between the other facet of the semiconductor substrate and the diffraction grating, the low refractive index regions having a refractive index lower than a refractive index of the upper cladding layer, a length of each of the low refractive index regions in a waveguide direction being 5 µm or longer.

2. The optical semiconductor device according to claim 1, wherein the diffraction grating includes a plurality of recesses formed in the upper cladding layer and disposed periodically in a waveguide direction of the waveguide region, sidewalls of the recesses define a width of the waveguide region.

3. The optical semiconductor device according to claim 2, wherein material having the refractive index lower than the refractive index of the upper cladding layer is contained in the recesses of the diffraction grating.

4. The optical semiconductor device according to claim 1, wherein the low refractive index regions include recesses formed in the upper cladding layer.

5. The optical semiconductor device according to claim 4, wherein material having a refractive index lower than the refractive index of the upper cladding layer is contained in the recess of the low refractive index region.

6. The optical semiconductor device according to claim 2, wherein a distance between a pair of low refractive index regions disposed on both sides of each of the end regions is wider than a width of the distributed feedback region.

7. The optical semiconductor device according to claim 1, wherein the diffraction grating and the low refractive index region are located at a distance equal to or greater than a half of a period of the diffraction grating in a waveguide direction from each other.

8. The optical semiconductor device according to claim 7, wherein the distance between the diffraction grating and the low refractive index region is equal to or less than ten times of the period of the diffraction grating.

9. The optical semiconductor device according to claim 3, wherein the low refractive index regions include recesses formed in the upper cladding layer, the material contained in the recesses of the diffraction grating is a same as material contained in the recesses of the low refractive index regions.

10. The optical semiconductor device according to claim 1, wherein the diffraction grating and each of the low refractive index regions are disposed away from each other in the waveguide direction.

* * * * *